United States Patent
Ferrera et al.

(10) Patent No.: US 6,822,248 B2
(45) Date of Patent: Nov. 23, 2004

(54) SPATIAL PHASE LOCKING WITH SHAPED ELECTRON BEAM LITHOGRAPHY

(75) Inventors: Juan Ferrera, Fremont, CA (US); James G. Goodberlet, Melrose, MA (US); Timothy R. Groves, Fulbourn (GB); John G. Hartley, Fishkill, NY (US); Mark K. Mondol, Cambridge, MA (US); Mark L. Schattenburg, Wayland, MA (US); Henry I. Smith, Sudbury, MA (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 09/809,766

(22) Filed: Mar. 15, 2001

(65) Prior Publication Data

US 2002/0130274 A1 Sep. 19, 2002

(51) Int. Cl.$^7$ ................................................ H01J 37/08
(52) U.S. Cl. ............................ 250/492.22; 250/492.2; 250/398
(58) Field of Search .................. 250/492.2, 492.22, 250/398, 492.1, 492.23

(56) References Cited

U.S. PATENT DOCUMENTS

| | | | | |
|---|---|---|---|---|
| 4,393,312 A | * | 7/1983 | Collier et al. | 250/492.2 |
| 5,311,026 A | * | 5/1994 | Saitou et al. | 250/492.23 |
| 5,831,272 A | * | 11/1998 | Utsumi | 250/492.2 |
| 5,932,884 A | * | 8/1999 | Aizaki | 250/492.2 |
| 6,333,508 B1 | * | 12/2001 | Katsap et al. | 250/492.2 |

OTHER PUBLICATIONS

Goodberlet et al., "Extending Spatial–Phase–Locked Electron–Based Lithography to two Dimensions", Applied Physics, Dec. 1997, pp. 7557–7559.*
Goodberlet et al.; "A One–Dimensional Demonstration of Spatial–Phase–Locked Electron–Beam Lithography"; Elsevier Science B.V. —Microelectronic Engineering; 1997; pp. 473–476.
Goodberlet et al; "Extending Spatial–Phase–Locked Electron Beam Lithography to Two Dimensions"; Jpn. J. Appl. Phys., vol. 36, Pt. 1, No. 12B; 1997; pp. 7557–7559.

* cited by examiner

Primary Examiner—John R. Lee
Assistant Examiner—Paul M. Gurzo
(74) Attorney, Agent, or Firm—Whitham, Curtis & Christofferson, P.C.; Jay H. Anderson

(57) ABSTRACT

Fine positioning of a shaped or patterned charged particle beam without use of intrusive fiducial marks is achieved by providing a dithered shadow pattern, preferably in the form of a grid, within the shaped or patterned charged particle beam. Light output from fiducial marks preferably formed of a scintillating material is reduced when the dithered shadow pattern is incident on some or all of the fiducial marks. The timing of the incidence of the shadow pattern on fiducial marks indicates the position of the shaped or patterned charged particle beam such that correction of the beam position on the target can be corrected to a small fraction of system resolution. The dither pattern and repetition period is chosen to avoid interference with uniformity of beam illumination of the target. Feedback of position error thus provides phase locked position correction in real time and is suitable for mask making since the fiducial marks are not intrusive.

20 Claims, 3 Drawing Sheets

SPATIAL PHASE LOCKING WITH SHAPED ELECTRON BEAM LITHOGRAPHY

BACKGROUND OF THE INVENTION

1. Field of the Invention

The present invention generally relates to charged particle beam tools and, more particularly, to systems for locating an electron beam with high positional accuracy on a target in a shaped beam lithography tool.

2. Description of the Prior Art

Lithography is a technique utilized, for example, in the manufacture of semiconductor integrated circuits. While increases in performance, functionality and manufacturing economy have been derived from increased integration density, many additional techniques have been developed at much smaller sizes than can be resolved lithographically, a lithographic process is basic to determining the location and basic dimensions of both electrically active (e.g. transistors) and passive (e.g. conductors, storage capacitors) devices on a wafer which is later diced into individual chips. Therefore, increases in integration density have required that minimum lithographic feature size dimensions be reduced dramatically. At the present time, minimum feature size regimes are required which cannot be reliably produced with electromagnetic radiation (e.g. deep ultraviolet (DUV) light). Therefore, charged particle beams have been used for lithographic resist exposure when features below about 0.25 microns must be resolved.

Electron beam exposure tools have become the lithographic resist exposure tool of choice for such small minimum feature size regimes. However, increased integration density implies increased integrated circuit complexity and multiple exposures are generally required to develop the desired lithographic pattern for the chip. Such multiple exposures must be made with extreme positional accuracy and at high repetition rates to develop adequate throughput comparable to that of visible light or DUV resist exposure tools.

The most basic of electron beam lithography exposure tools is referred to as a probe-forming tool which is structurally similar to a cathode ray tube and capable of exposing only a single pixel at a time. Such a tool does not have an acceptable level of throughput for manufacturing applications with patterns that may include billions of pixels and is generally used only for extremely small production runs of application-specific integrated circuits (ASICs) of substantially unique design. To greatly increase throughput, electron-beam-projection lithography tools have been developed which allow exposures of sub-fields containing perhaps several million pixels by passing a relatively broad electron beam through a patterned mask so that the pattern of the mask is projected on the target. Between these extremes are shaped-beam-lithography tools which shape only the outer perimeter of a relatively broad beam to simultaneously expose several dozen to several hundred pixels at a time.

Shaped-beam-exposure tools may provide shaping of the beam in several ways. For example, a mask can be provided with numerous desired shapes and the mask moved to place an aperture of a desired shape in the beam path in a manner similar to an electron beam projection lithography tool. However, the settling time for mechanical movement of the mask reduces the maximum exposure rate that can be achieved and this limitation is very significant in view of the relatively small number of pixels which can be simultaneously exposed.

To overcome this limitation, shaped-beam-exposure tools have been developed which use two (or more) aligned, generally square, shaping apertures with a deflection arrangement there between. Thus a beam shaped by a first shaping aperture is caused to overlay (and be intercepted by) only a portion of the second shaping aperture in order to develop, for example, rectangular shapes of desired aspect ratios. Such a system, while avoiding mechanical movement of parts, presents problems of positioning since the shaped beam will be asymmetrically located with respect to the original beam and include stationary edges formed by the second shaping aperture and variable edges formed by the first aperture. Therefore, complementary deflection after shaping will result in the beam being off-axis, To avoid undue complication in achieving a desired positioning the beam at the target, a corner of the shaped beam formed by the second shaping aperture is used as a reference point.

In this regard, it should be understood that, in all types of electron-beam-exposure tools, while positional errors in beam location may be sensed and corrected by a feedback arrangement, beam positioning is "open loop" at the point that the actual exposure is made since the beam position cannot be sensed in a manner which is consistent with the resist exposure at the instant the exposure is made. Therefore, historically, accurate placement of the beam during exposure with a probe forming lithography tools has relied on the stability of the probe forming tool after it has undergone or performed some calibration or registration process. In the best of probe forming systems, the probe beam is caused to scan a sparse array of targets located on the substrate either initially and/or periodically between lithographic pattern exposures. The time between scanning of the targets thus "closes the loop" in providing feedback to the system to correct the probe beam location although the operation of such an arrangement is not continuous and relies to some degree on system stability. That is, at the time of exposure, no additional, real-time measurement of beam location error or beam position correction can be performed.

For this purpose, use of a scintillating grid as a sparse target array has been suggested in "Extending Spatial-Phase-Locked Electron-Beam Lithography to Two Dimensions" by Goodberlet et al., Jpn. J. Appl. Phys., Vol. 36 (1997), pp. 7557–7559, which is hereby fully incorporated by reference. Light output from the scintillating grid is detected during beam scanning to determine points in time when the electron beam in incident thereon. Difference of color of light output and difference of spatial frequency of grid lines are suggested for distinguishing between coordinate directions. However, the techniques for obtaining beam position information described therein and in U.S. Pat. No. 5,136,169 by H. I. Smith rely on the narrowness of the probe beam in probe-forming electron-beam tools and thus are not applicable to charged particle beam tools having a broad beam as is required for acceptable production throughput.

Further, there is an additional class of lithographic exposures known as mask making (e.g. for making reticles for use in any optical, deep UV, extreme UV, electron-projection, ion-projection, and x-ray lithography tools), which does not allow for placement of registration targets on the workpiece or otherwise in the target plane. For this class of exposures, the pattern placement accuracy depends on a process known as emulation whereby the patterned substrate is characterized by an external metrology tool and the positional error information is fed back to the tool for subsequent exposures. This mode of operation is known as blind writing and the time between external measurement and subsequent corrected exposure may be measured in days. This mode of operation only succeeds when the tool possesses extreme stability.

It should be appreciated from the foregoing that the conventional practice of electron-beam exposures complicate or, in the case of mask making, prevent positional correction or compensation at the time of the exposure. Further, known feedback arrangements such as that disclosed in the above-incorporated article and U.S. Pat. No. 5,136,169 are limited to use with probe-forming tools that provide a single, small, round-exposure spot scanned in a rasterized fashion, and are not applicable to electron-beam tools which use a broader shaped or patterned beam to provide increased throughput. At the same time, high positional accuracy of electron beam location is often even more critical to properly stitch together sequentially exposed features than in a probe-forming-electron-beam tool. For example, in shaped beam or other electron-beam-projection tool exposures, positioning accuracy at the edge of the exposure should be held to a very small fraction of the minimum feature size to prevent, for example, excessive narrowing of a structure such as a conductor where adjacent exposures are joined.

SUMMARY OF THE INVENTION

It is therefore an object of the present invention to provide a spatial phase locking system for achieving accurate beam positioning which can provide continuous beam position correction and which is operable with charged-particle-beam tools which produce a broad beam, such as shaped beam and electron-beam-projection lithography tools.

It is another object of the invention to provide a reduction of the requirement of extreme stability or criticality of charged particle-beam-exposure tools, particularly of the shaped-beam and beam-projection type.

In order to accomplish these and other objects of the invention, a method of operating a charged particle beam tool is provided including steps of dithering a shadow pattern relative to and within a charged particle beam, and detecting incidence of said shadow pattern on a sparse array of targets.

In accordance with another aspect of the invention, a method of operating a charged particle beam lithography tool is provided including steps of causing a moving shadow pattern within a shaped or patterned charged particle beam, deflecting the shaped or patterned charged particle beam to a desired location on a target, and correcting deflection based on a time of incidence of the moving shadow pattern on fiducial marks on the target.

In accordance with a further aspect of the invention, a charged particle beam lithography tool including a source of a beam of charged particles, a grid for causing a shadow pattern within the charged particle beam, a deflector for dithering the shadow pattern, an aperture for shaping said charged particle beam, a deflector for deflecting said charged particle beam to a desired location on a target including fiducial marks, a detector for detecting when said dithered shadow pattern is incident on said fiducial marks, and an arrangement for generating a deflection correction in response to said means for detecting.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
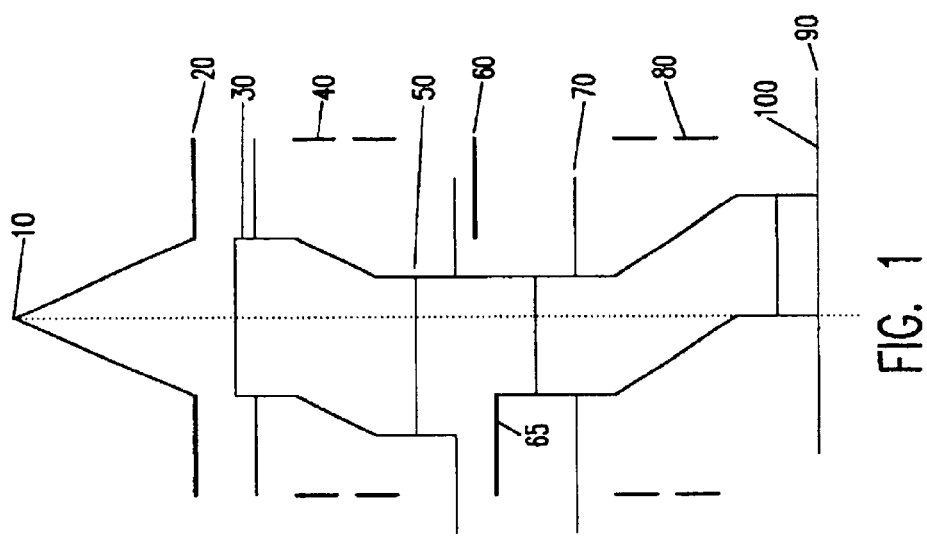
FIG. 1 is a simplified diagrammatic representation of a conventional-shaped-electron beam-lithography tool.

Referring now to the drawings, and more particularly to FIG. 1, there is shown a diagrammatic representation of a conventional shaped beam lithography tool. The basic concept of a shaped beam tool is to provide two aligned and generally congruent shaping apertures 20 and 60 and to deflect the beam as shaped (e.g. generally square) by the first shaping aperture 20 such that the beam only partially overlaps, and is partially intercepted by, the second shaping aperture 60, developing a rectangular beam shape (or other shape depending on the shape of the shaping apertures and the degree of overlap) of substantially arbitrary aspect ratio. The shape or feature can be changed very rapidly since it is performed by beam deflection rather than any mechanical translation of the plates including the shaping apertures. The shaped beam or feature can then be deflected as desired to impinge on a selected location on the target.

More specifically, the optics of the conventional shaped beam tool (insofar as may be relevant to an understanding of the present invention) includes an electron source 10 and a first shaping aperture 20 (which intercepts a portion of the beam which generally serves to make the electron intensity/density distribution across the beam more uniform) resulting in a (generally square) shaped beam 30. A shaping deflector 40 is provided immediately after the first shaping aperture 20 to deflect the beam off-axis and then return the beam trajectory to parallel to the beam column axis to provide a shifted shaped/square image 50.

While the beam is assumed to be well-collimated by other elements otherwise unimportant to the practice of the invention and the second shaping aperture 60 is assumed to be congruent to and aligned with the first shaping aperture 20, the off-axis shifting of the beam by shaping deflector 40 causes a portion of the shifted shaped/square beam 50 to impinge on an area 65 of the second shaping aperture 60; resulting in a shaped image 70 cross-section beam by truncating the beam with an edge that produces a corresponding boundary of the beam referred to as the stationary edge. This shaped image beam 70 or feature is then deflected to a desired position by position deflector 80 to provide a shaped and positioned image or feature 90 on the target 100.

Figure 2:
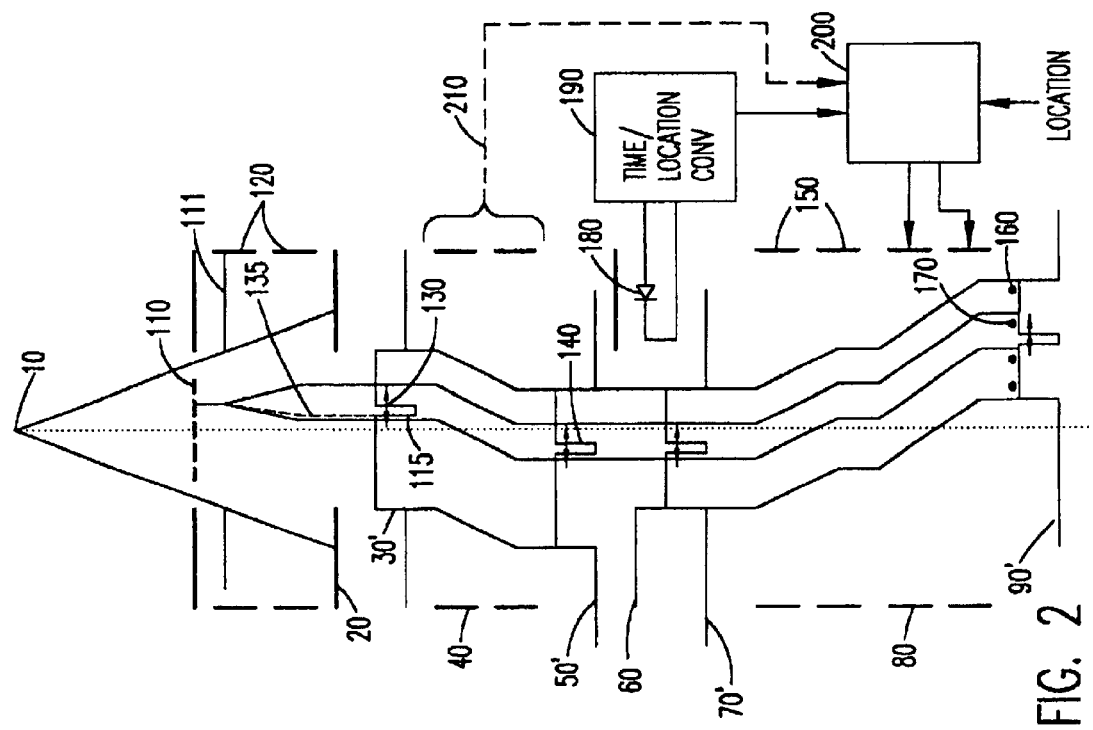
FIG. 2 is a shaped-beam-lithography tool in accordance with the invention.

Referring now to FIG. 2, the invention and its operation will now be discussed. For clarity, the invention will be discussed in connection with a shaped beam lithography tool but it will be recognized by those skilled in the art that the invention is also applicable to electron-beam-projection-lithography tools and other charged particle-beam systems in which accurate beam positioning is of importance. Further, elements which are common to the shaped-beam system of FIG. 1 are depicted having the same reference numerals, and elements which are common to FIG. 1 but with modified function in accordance with the invention are differentiated from corresponding elements of FIG. 1 by application of a "prime" marking applied to a like reference numeral.

It will be immediately apparent from a comparison of FIGS. 1 and 2 that the invention additionally includes a probe mesh 110 and a probe dither deflector 120. The probe mesh 110 is preferably a fine wire grid of metal or other material capable of absorbing or backscattering electrons emitted from electron source 10. (A contrast aperture 111 may be included to prevent scattered electrons from further interfering with the beam.) A lithographically produced pattern of, for example, gold on a thin silicon substrate is suitable for the practice of the invention, as are many other structures which will be apparent to those skilled in the art. While relatively fine features are preferred in the probe mesh, sufficient robustness to the incident electron current must be provided. Resolution of the system is maximized by the sensing of edges of features of the probe mesh. Hence, fine features are preferred to preserve beam current while providing a relatively greater length of feature edges. Transmissivity of the probe mesh 110 is preferably 90% or greater.

Even with such transmissivity of the probe mesh, the inclusion of probe mesh 110 intercepts a portion of the beam current, effectively causing a grid-shaped (although the particular pattern is not at all important to the practice of the invention) shadow of varying illumination across the beam. In essence, each edge where illumination varies functions as a probe, as will be discussed more fully below. This probe, however, is constituted by a pattern of relative absence of beam current in small regions of the beam, directly contrary to the nature of a probe in known systems where the probe is generally constituted by a small spot formed by the entire beam.

The entire beam prior to the first shaping aperture 20 including the shadow pattern produced by probe mesh 110 is moved through a small repetitive pattern at high speed, referred to as dithering, by suitable energization of probe dither deflector 120. The probe dither deflector 120 operates in much the same manner as shaping deflector 40 or position deflector 80, described above, except that the off-axis deflection and return of the beam to a trajectory parallel to the electron beam column axis is performed repetitively and over a distance which is usually much smaller and without regard to either intended beam shape or final location on the target. It should be noted that while the principles of the invention in regard to dithering could, in theory, be carried out on the beam at any location in the beam column, it is considered preferable to perform dithering prior to any other deflection or shaping of the beam. Thus, as shown, the probe mesh 110 and dither deflector 120 are located prior to the first shaping aperture 20 which thus provides a stationary shaped (e.g. square) beam image 30' with the shadow pattern of the probe mesh 110 moving within it.

As shown at 130 of FIG. 2, the illumination pattern across the cross-section of the beam will be uniform except where a feature of the probe mesh 110 casts a shadow that is dithered back and forth (for example) over a portion of the beam. As indicated by dashed line 135, a sharp dip 115 in the illumination profile is oscillated or 'dithered' laterally as indicated by the double arrow. This dithering or oscillation is characterized by both a spatial range or excursion and a temporal period (i.e., the time to complete a full dither cycle). The range of dither motion preferably matches the periodicity or pitch of features of probe mesh 110. The dithering thus serves the dual purposes of 1.) moving the irregularity of illumination constituted by the shadow 115 of a probe mesh feature such that beam current over the mesh spatial period, is again made substantially uniform and 2.) providing for the dithered shadow 115 to be incident on a target of a sparse array of targets at the target plane or (e.g. wafer) surface only once each dither temporal period, and with a timing that is correlated to the position of the projected feature.

Figure 3:
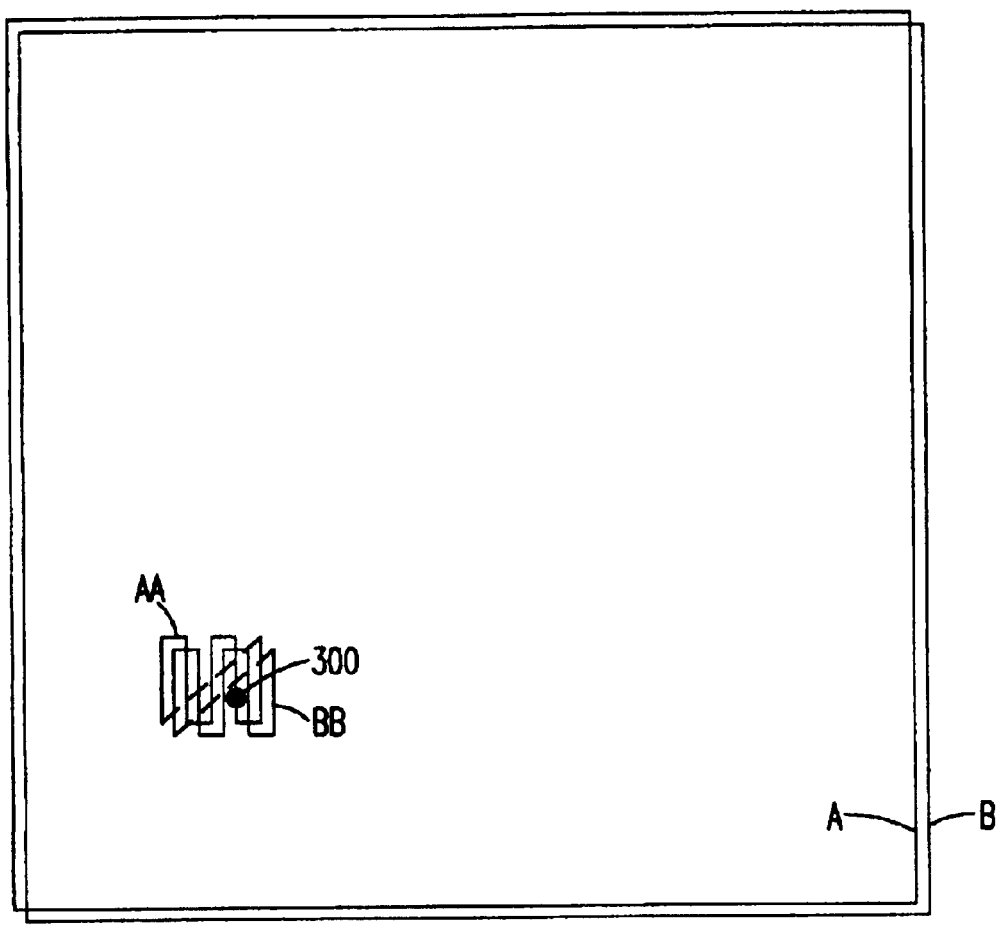
FIGS. 3, 3A and 3B are diagrams helpful in visualizing the operation of the invention.

That is, referring to FIG. 3, the beam as shaped by at least first shaping aperture 20 is shown in two potential locations, A and B. It should be appreciated that FIG. 3 shows little if any shaping by the second shaping aperture 60 and, hence, could represent the beam either below the first shaping aperture or at the target. However, it should be understood that inaccuracy of position immediately below the first shaping aperture would be unusual but is possible and any such error would continue or increase along the beam path to the target. The important showing of FIG. 3 is that, assuming the positional differences of the beam at locations A and B to represent a positional error, if the probe mesh is positioned and dither deflection provided above the first shaping aperture 20, the dither path (e.g. corresponding to the path of a single point on the probe mesh 110), as depicted at AA and BB, respectively, will also exhibit the same positional shift and error.

At the same time, the instantaneous position of the shadow of the probe mesh is in preferably continuous motion. Thus, the position of the beam (or projected feature) can be detected in accordance with the time at which a shadow of an arbitrary point on probe mesh 110 is caused to cross a target of a sparse array of targets, alluded to above. For example and recalling that the shadow of all points on the probe mesh 110 follow the dither path (e.g. every point of the shadow moves precisely parallel to every other point as the shadow of the probe mesh 110 is dithered), the time at which the shadow of the probe mesh will cross an arbitrary target location (e.g. 300) will differ depending only on the beam or projected feature position.

Figure 3A:
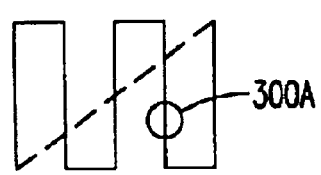
Figure 3B:
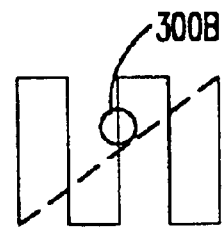

That is, the dither patterns of FIGS. 3A and 3B are executed precisely in synchronism over any and all parts of the beam cross-section (including the portion passed by the second shaping aperture 60 i.e., the projected feature) and the different locations 300a and 300b (both corresponding to a single target location 300) in the dither pattern are traversed at different times during a cycle of the dither pattern, reflecting the beam positions A and B respectively. Thus a positional error can be quantitatively evaluated in both coordinate directions and a compensation signal developed and position deflection signals applied to place the beam precisely at the intended location.

It will be recalled from the foregoing that the nature of the target and the sparse target array are not critical to the practice of the invention. For example, a small electrode may be used to intercept beam current when the beam is in a particular position. However, provision of a circuit to carry the intercepted beam current to a current detection circuit is generally inconvenient on a semiconductor wafer undergoing a lithographic exposure. Therefore, a scintillating material such as that described in the above-incorporated article is much preferred as a target for the practice of the invention. Alternatively, U.S. Pat. No. 5,136,169 and technical article by H. I. Smith at el refers to other signals that can be picked up, such as secondary electrons, which would be indicative of location on a fiducial grid.

For mask making it is desirable that the step of pattering the fiducial grid on the mask be unintrusive as possible while providing maximum signal to noise ratio. A metal back scatter potentially interferes with the mask processing and the signal to noise ratio is dependent on the relative back scatter coefficients and percent coverage of fiducial grid. For the scintillator approach in accordance with the invention, the signal to noise ratio is improved due to the absence of photon radiation off the fiducial grid. Such a material emits light when electrons are incident on it and the resultant light can be detected by a sensor such as a photo-diode or photomultiplier 180 (FIG. 2) that may be placed at a location in the tool that does not interfere with operation of the tool or the lithographic exposure.

It was noted above that the position sensing arrangement suggested in the above-incorporated article is not applicable to broad beams since the positional resolution is effectively limited by beam cross-sectional dimensions. Therefore, the use of scintillating material in accordance with the invention is markedly different from the previously suggested arrangement and will now be discussed with reference to FIG. 4.

Figure 4:
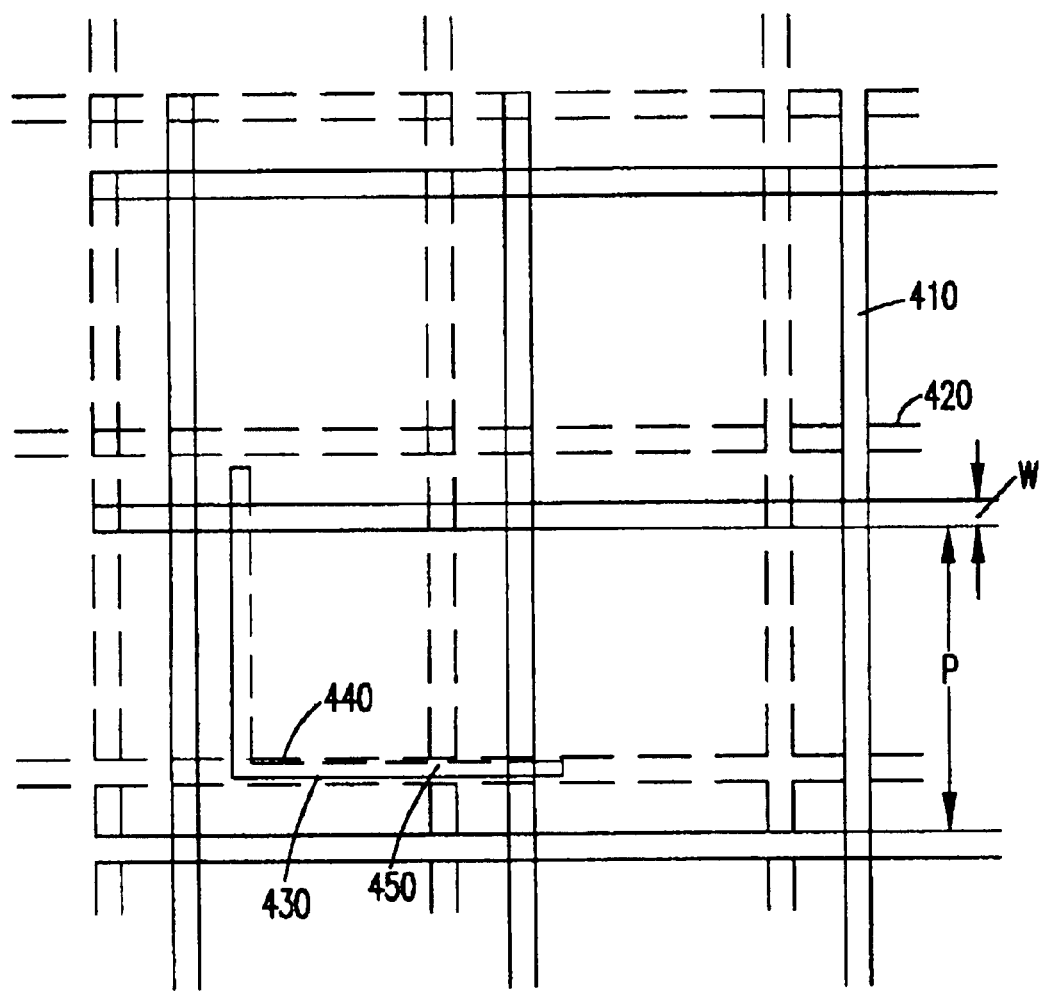
FIG. 4 is a plan view of preferred dither patterns for use with the invention superimposed on a plan view of a representative portion of a preferred sparse target array.

Specifically, in accordance with the invention, the pattern of scintillating material 410 is placed on the wafer and patterned to provide an extremely precise grid pattern to match the (e.g. demagnified) shadow image 420 of the probe mesh 110, as shown by solid and dashed lines, respectively in FIG. 4. Various arrangements may be used to form the scintillator pattern, including interferometric exposure or near-field holography techniques which are known to those skilled in the art. The dimensions and pattern of the probe grid 110 are not particularly important to the practice of the invention. However, an exemplary probe grid suitable for practice of the invention may have orthogonal stripes, as shown, with a width, w, of about two microns and a pitch, p, of about twenty-four microns; yielding a transmissivity of about 85%. This pattern is demagnified by the electron optics so that the dimensions are finer at the target location. The spatial period of the grid at the target/substrate location should preferably be finer than the minimum feature size projected onto the target. Spatial periods of 200 nm and 100 nm are readily achieved by interferometric techniques.

While high transmissivity is preferred, these probe mesh dimensions are convenient since the shaping apertures are generally about 240 microns; yielding ten stripes in each coordinate direction. The number of stripes must be sufficient that at least one stripe remains in each coordinate direction after the beam is shaped by the shaping apertures. The stripe width must also not be so narrow that contrast in the shadow image 420 is significantly reduced by slight variations of electron trajectory in the beam. Perhaps more importantly, however, the range or displacement of the dither pattern must be only slightly less than the pitch of the probe mesh features, referred to the target plane so that the shadow features will substantially cover the area of the shaped spot and the dither pattern must be executed within a time that is shorter than the exposure time for a projected feature. The dithering of the shadow image of the probe grid over the target stripes results in a signal which depends, in part, on the response time of the scintillator material. This signal must be within the bandwidth of the detector, including the response time of the scintillating material. Further, if a raster dither pattern or the like is used the pitch of the raster lines must not exceed stripe width in order to assure reliable detection.

As shown in FIG. 4, the shapes of the shadow image of the probe grid and the pattern of scintillating material are substantially congruent. Therefore, depending of the transmissivity of the probe mesh 110, an equal percentage of the scintillating material will be emitting light unless the shadow image exactly overlays the scintillating material, in which case, light emission will cease or be reduced while the scintillating material is within the shadow image. By the same token, when stripes of the shadow image in only one coordinate direction overlie stripes of scintillating material, light emission from the scintillating material will be reduced by about one-half. Accordingly, as the shadow image 420 is dithered over the pattern of scintillating material 410, light output from the scintillating material will be substantially constant except for brief periods when stripes in one or both coordinate directions of the shadow image are swept across corresponding stripes of the scintillating material pattern 410, whereupon light output from the scintillating material will be sharply reduced.

Therefore, it can be seen that a dither pattern having a number of parallel scan lines at a sufficiently fine pitch will provide the maximum signal to noise ratio for position detection as well as the most uniform illumination/dose of a shaped spot since the shadow pattern 420 will be swept evenly over the area of the dither pattern during each repetition of the pattern during an exposure of a projected feature. Conversely, however, the illumination will not be uniform if the duration of the dither pattern is not well-matched to the exposure or flash time of a projected feature which can be very short. Therefore, a dither pattern of closely spaced scan lines, such as the raster of FIG. 3 is often not practical. Moreover, there is also a trade-off between potential increase of dose uniformity with increased transmissivity achieved through more narrow shadow image stripes, dither pattern path length and scan speed within practical noise levels and detector bandwidth.

Therefore, substantial performance gains and acceptable operating margins adequate to the practice of the invention and consistent with adequate illumination/dose uniformity can be achieved with a simplified dither pattern with significantly shortened dither pattern path length. Specifically, it is preferred to provide a dither pattern 430 in the angled shape of an "L" having legs of equal length or proportioned to the stripe pitch in each coordinate direction. (For purposes of this illustration, the dither pattern is shown as the locus of the crossing 450 of two orthogonal stripes of the shadow image. However, it should be understood that this reference is arbitrary and each point of the entire pattern 420 moves in parallel during the dither pattern and any arbitrary point could be used as a reference and the dither pattern illustrated at any location.)

This dither pattern is of minimum path length and presents a potential ambiguity in illumination response only in the case where shadow image stripes 420 in one or both coordinate directions fortuitously overly stripes in the pattern of scintillating material 410. However, this potential ambiguity can be overcome by providing an offset in the return path as shown at 440 by approximately the width of a stripe of scintillating material 410. This variant form of the preferred dither pattern does not significantly increase path length since the dither pattern must be traversed bidirectionally in any case.

The preferred dither pattern thus provides a reduction of light output of about one-half as stripes of the shadow image are swept across stripes of scintillating material in each coordinate direction. The limitation of the length of the legs of the dither pattern to slightly less than the stripe pitch avoids ambiguities in position detection since only one instance of light output reduction will be produced for each leg of the dither pattern 430.

As discussed above, in connection with FIG. 3, the timing of the light output reduction can be directly converted to a position measurement by a suitable converter 190, familiar to those skilled in the art, the details of which are unimportant to the practice of the invention. By choice of an arbitrary reference location, the position measurement can then be directly converted to a positional error signal and a suitable correction of the beam position deflection signal made at driver 200 for the position deflector 80.

In this regard, it should be noted from FIG. 2 that a shaped beam dither compensation deflector 150 may be provided and driven proportionally to the beam shaping deflector 40. However, this compensation can also be provided through position deflector 80 as shown by dashed line 210. This compensation, however provided, is performed to return the dither pattern from the off-axis positioning due to shaping deflection to the same position relative to the system axis as it occupied upon exiting the first shaping aperture 20 and avoids ambiguity if the error exceeds the shadow image stripe pitch and decouples the position of the dithered probe from the amount of shaping performed.

The action of the dither compensator on the shaped edge of the spot is to reverse the apparent stationary and moving edges. The conventions in a tool control command could be reversed to the conventional shaped beam system. This only serves to keep the tool control data comparable between FIG. 1 and FIG. 2.

It should also be recognized that the probe mesh pattern can be made to (and preferably does) extend over the entirety of the beam cross-section, and in the same manner that the invention is independent of the degree of beam shaping as long as some features of the shadow image 420 remain in the beam, the invention is also applicable to any other charged particle beam tool which can provide a relatively broad beam, such as electron beam projection lithography tools in which positional accuracy is particularly critical. In such systems, even though a significant portion of the beam may be blocked by a patterned reticle, numerous features of the dithered shadow image would generally be allowed through the reticle. Further, since the sub-field image is not truncated in the manner of a shaped beam tool, and the transmissivity and dimensions of a given sub-field pattern is constant, signal-to-noise ratio and positioning accuracy may be enhanced in such applications.

In view of the foregoing, it is seen that the invention provides an arrangement for continuously monitoring and correcting position of a relatively broad charged particle beam provided by shaped beam and electron beam projection tools supporting production-level throughput which can be performed simultaneously with lithographic exposure even in mask making operations where blind writing was previously required. Since beam position can be continuously corrected without reducing throughput, stability of charged particle beam tools is made much less critical.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of operating a charged particle beam tool, said method including steps of
   dithering a shadow pattern relative to and within a charged particle beam, and
   detecting incidence of said shadow pattern on a sparse array of targets or fiducial marks.

2. A method as recite in claim 1 wherein said dithering step includes steps of
   imposing said shadow pattern on said charged particle beam,
   deflecting said charged particle beam in a dither pattern, and
   passing said charged particle beam through a shaping aperture.

3. A method as recited in claim 2, including further steps of
   deflecting said charged particle beam, and
   intercepting a portion of said charged particle beam with a second shaping aperture while shaping a remainder of said charged particle beam passed through said second shaping aperture.

4. A method as recited in claim 1, including the further steps of
   passing said charged particle beam through a first shaping aperture,
   deflecting said charged particle beam, and
   intercepting a portion of said charged particle beam with a second shaping aperture while shaping a remainder of said charged particle beam passed through said second shaping aperture.

5. A method as recited in claim 1, wherein said detecting step includes steps of
   projecting a portion of said charged particle beam on a target including fiducial marks of scintillating material, and
   detecting reduction in light output when said dithered shadow pattern is incident on one or more of said fiducial marks.

6. A method as recited in claim 5, wherein said dithering step is performed by moving said shadow pattern in a repeated pattern having a repetition time.

7. A method as recited in claim 6, wherein said repetition time is similar to a spot exposure time.

8. A method as recited in claim 6, wherein said repeated pattern is a raster.

9. A method as recited in claim 6, wherein said repeated pattern is an angled shape.

10. A method as recited in claim 9, wherein said angled shape is retraced with an offset.

11. A method as recited in claim 1, wherein said dithering step is performed by moving said shadow pattern in a repeated pattern having a repetition time.

12. A method as recited in claim 11, wherein said repetition time is similar to a spot exposure time.

13. A method as recited in claim 11, wherein said repeated pattern is a raster.

14. A method as recited in claim 11, wherein said repeated pattern is an angled shape.

15. A method as recited in claim 14, wherein said angled shape is retraced with an offset.

16. A charged particle beam lithography tool including
    a source of a beam of charged particles
    means for causing a shadow pattern within said charged particle beam,
    means for dithering said shadow pattern,
    means for shaping said charged particle beam,
    means for deflecting said charged particle beam to a desired location on a target including fiducial marks or sparse array of targets,
    means for detecting when said dithered shadow pattern is incident on said fiducial marks, and
    means for generating a correction for said means for deflecting in response to said means for detecting.

17. A charged particle beam lithography tool as recited in claim 16, wherein said fiducial marks comprise scintillating material.

18. A charged particle beam lithography tool as recited in claim 17, wherein a pattern of said fiducial marks correspond to said shadow pattern referred to a target.

19. A charged particle beam lithography tool as recited in claim 16, wherein said beam including said shadow pattern is dithered prior to passing through said means for shaping.

20. A method of operating a charged particle beam lithography tool including steps of causing a moving shadow pattern within a shaped or patterned charged article beam, deflecting said shaped or patterned charged particle beam to a desired location on a target, and correcting said deflecting step based on a time of incidence of said moving shadow pattern on fiducial marks on said target.

* * * * *